United States Patent [19]
Vayman

[11] Patent Number: 5,010,040
[45] Date of Patent: Apr. 23, 1991

[54] METHOD OF FABRICATING SOLAR CELLS

[75] Inventor: Zinovy Y. Vayman, Brookline, Mass.

[73] Assignee: Mobil Solar Energy Corporation, Billerica, Mass.

[21] Appl. No.: 292,492

[22] Filed: Dec. 30, 1988

[51] Int. Cl.$^5$ ............................................. H01L 21/02
[52] U.S. Cl. ................................... 437/230; 437/4; 437/174; 437/194
[58] Field of Search ................... 437/4, 230, 174, 935, 437/946, 194; 148/DIG. 90; 427/53.1

[56] References Cited

U.S. PATENT DOCUMENTS

| | | | |
|---|---|---|---|
| 4,321,283 | 3/1982 | Patel et al. | 437/230 |
| 4,557,037 | 12/1985 | Hanoka et al. | 437/230 |
| 4,609,565 | 2/1986 | Yates | 437/230 |
| 4,612,698 | 9/1986 | Gonsiorawski | 437/230 |
| 4,895,735 | 1/1990 | Cook | 427/53.1 |

Primary Examiner—Brian E. Hearn
Assistant Examiner—Linda J. Fleck
Attorney, Agent, or Firm—Pandiscio & Pandiscio

[57] ABSTRACT

A method of forming a metallization pattern on a substrate used in the fabrication of a solar cell or other semiconductor device. The metallization pattern is formed by (1) hydrogen passivating a silicon substrate having a P/N junction formed therein adjacent one surface of the substrate, with a damaged surface layer being formed in conjunction with the hydrogen passivation process, and (2) laser annealing selected portions of said damaged layer whereby said selected portions form a metallization pattern to which selected metals will securely adhere when applied by immersion plating. The foregoing fabrication steps may be performed simultaneously.

A layer of material comprising SiO$_x$ may be redeposited on the one surface of the substrate as part of the hydrogen passivation procedure. In the laser annealing step, sections of the redeposited material scanned by the laser beam are ablated and the exposed underlying damaged surface layer is annealed.

14 Claims, 3 Drawing Sheets

METHOD OF FABRICATING SOLAR CELLS

BACKGROUND OF THE INVENTION

1. Field of Invention

This invention relates generally to the fabrication of semiconductor devices and more particularly to a method of forming metallization patterns in a damaged hydrogen passivated surface layer.

2. Prior Art

Known semiconductor devices, such as photovoltaic cells, frequently comprise a plurality of conductive metallic segments attached to the front surface of a selected substrate for conducting current between various regions of the device. In the fabrication of such semiconductor devices, a plurality of relatively involved processing steps are typically required to prepare the surface of the substrate for metallization formation of the front surface conductors. These processing steps are required because the front surface of the substrate of conventional semiconductor devices is typically coated with a layer of material to which conductive materials deposited by known methods, e.g., the immersion plating process disclosed in U.S. Pat. No. 4321283, will not readily adhere. This front surface layer is typically a dielectric layer, e.g., a glass or silicon nitride layer or a damaged layer formed in the course of performing hydrogen passivation. The glass and silicon nitride layers provide hard protective coatings for the underlying silicon substrate. As discussed in U.S. Pat. No. 4691077 to Gregory et al, hydrogen passivation is used to reduce minority carrier recombination losses in polycrystalline silicon semiconductor materials.

Conventionally, metallization patterns are formed by selectively removing portions of the dielectric front surface layer using known photoresist and etching methods. Selected portions (depending on the process used) of the front surface of the substrate define the regions to which conductors will be attached. Examples of known solar cell photoresist and etching methods are taught in U.S. Pat. Nos. 4451969, 4557037, and 4612698.

Prior known methods for forming metallization patterns are not entirely satisfactory because they involve a relatively large number of processing steps. For instance, in U.S. Pat. No. 4451969, relating to the production of solar cells, the following steps are required to prepare a photovoltaic cell silicon substrate for metal plating:

(a) forming a polysilazane coating on a first surface of the substrate having a junction in the substrate adjacent the first surface;

(b) covering the polysilazane coating with a photoresist material;

(c) exposing the photoresist coating to radiant energy through a mask defining a two-dimensional pattern;

(d) chemically developing the photoresist so that selected portions of the photoresist are removed according to the two-dimensional pattern;

(e) etching away those portions of the polysilazane coating not covered by the photoresist; and (f) heating the silicon substrate at a temperature and for a time sufficient to:
 (1) effect removal of said photoresist material by pyrolysis, and
 (2) modify said polysilazane coating so that it has a relatively low etch rate.

Since the cost of semiconductor devices such as solar cells is dependent to a major extent upon the number of required fabrication steps, it is clearly desirable to be able to form metallization patterns using a process having fewer steps than the foregoing process.

Lasers have been used to remove, or alter the microstructure of various layers on substrates of semiconductor devices, in part, as a method of reducing the number of steps involved in fabricating the device. For instance, lasers have been used in conjunction with etchants to remove selected portions of semiconductor materials, as taught, for instance, in U.S. Pat. Nos. 4331504, 4401367, 4478677, 4490210, and 4490211. Lasers have also been used to alter the microstructure of portions of semiconductor materials to facilitate subsequent removal of the laser-scanned portions by specific surface etchants, as disclosed in U.S. Pat. Nos. 4335295 and 4415383. It also is known to cut holes by laser beam in thin films such as silicon nitride, copper and other conductor and semiconductor materials, as shown, for example, by U.S. Pat. Nos. Re: 27772, 4044222 and 4081653. Lasers have also been used to anneal predetermined areas of amorphous or polycrystalline semiconductor materials into single crystal areas, as disclosed by U.S. Pat. No. 4388145.

Prior known methods of altering the microstructure of electrical conductor or semiconductor materials have several disadvantages when applied to the fabrication of solar cells. First, to avoid damaging the P/N junction in photovoltaic cells, the intensity and duration of exposure to the laser beam must be carefully selected. Known laser processing methods tend not to be concerned with utilizing the laser beam in a manner preventing deterioration of the P/N junction of a solar cell. Second, in the case of U.S. Pat. No. 4388145, laser annealing tends only to be effective in those predetermined regions of the silicon substrate comprising a material substantially transparent to the laser beams. As such, the method of U.S. Pat. No. 4388145 tends to lack utility for annealing selected portions of a layer formed by hydrogen passivation of a silicon substrate.

OBJECTS OF THE INVENTION

A principal object of the present invention is to provide a method of fabricating solar cells wherein conductor metallization patterns are formed in conjunction with bulk hydrogen passivation of the solar cell substrate by exposing selective regions of the latter to laser energy.

A further object of the present invention is to provide a method of forming complex conductor metallization patterns in a relatively few number of steps and at a relatively high rate of speed.

Still another object of the present invention is to provide a method of forming a metallization pattern on a substrate used in the fabrication of a solar cell by bulk hydrogen passivating the substrate and annealing by laser energy selected regions of the damaged layer produced by the passivation so as to produce a metallization pattern.

Other objects of the invention are set forth in or rendered obvious by the following detailed description of a preferred embodiment of the invention.

SUMMARY OF THE INVENTION

The foregoing objects are realized by a process which, in a preferred embodiment as applied to the fabrication of crystalline silicon solar cells involves, inter alia, the following steps:

(a) hydrogen passivating the bulk region of a solar cell having a P/N junction formed in said cell adjacent a first surface thereof, and (b) laser annealing those portions of the damaged surface layer created by the hydrogen passivation to which conductors will subsequently be attached by immersion plating.

As used herein the term "immersion plating" means a process wherein an object is plated with a metal without the use of an externally applied electric field by immersing that object in a plating bath that does not contain a reducing agent, and the plating involves a displacement reaction. Immersion plating is distinguished from electroless plating in that the latter involves a plating bath that contains a reducing agent. An exemplary immersion plating method is disclosed in U.S. Pat. No. 4321283.

As used herein the term "damaged surface layer" means the surface layer of a substrate which has been damaged in conjunction with the hydrogen passivation of the substrate by a Kaufman ion source. The damaged surface layer differs from the passivated region of the substrate in that the damaged surface layer has a much higher incidence of crystalline defects, i.e. roughly an order of magnitude greater.

As used herein the term "annealing" means altering the damaged surface layer created by hydrogen passivation so that conductors deposited by immersion plating will adhere securely to altered portions of the damaged surface layer.

DETAILED DESCRIPTION OF THE INVENTION

Preferred Embodiment

Figure 1:
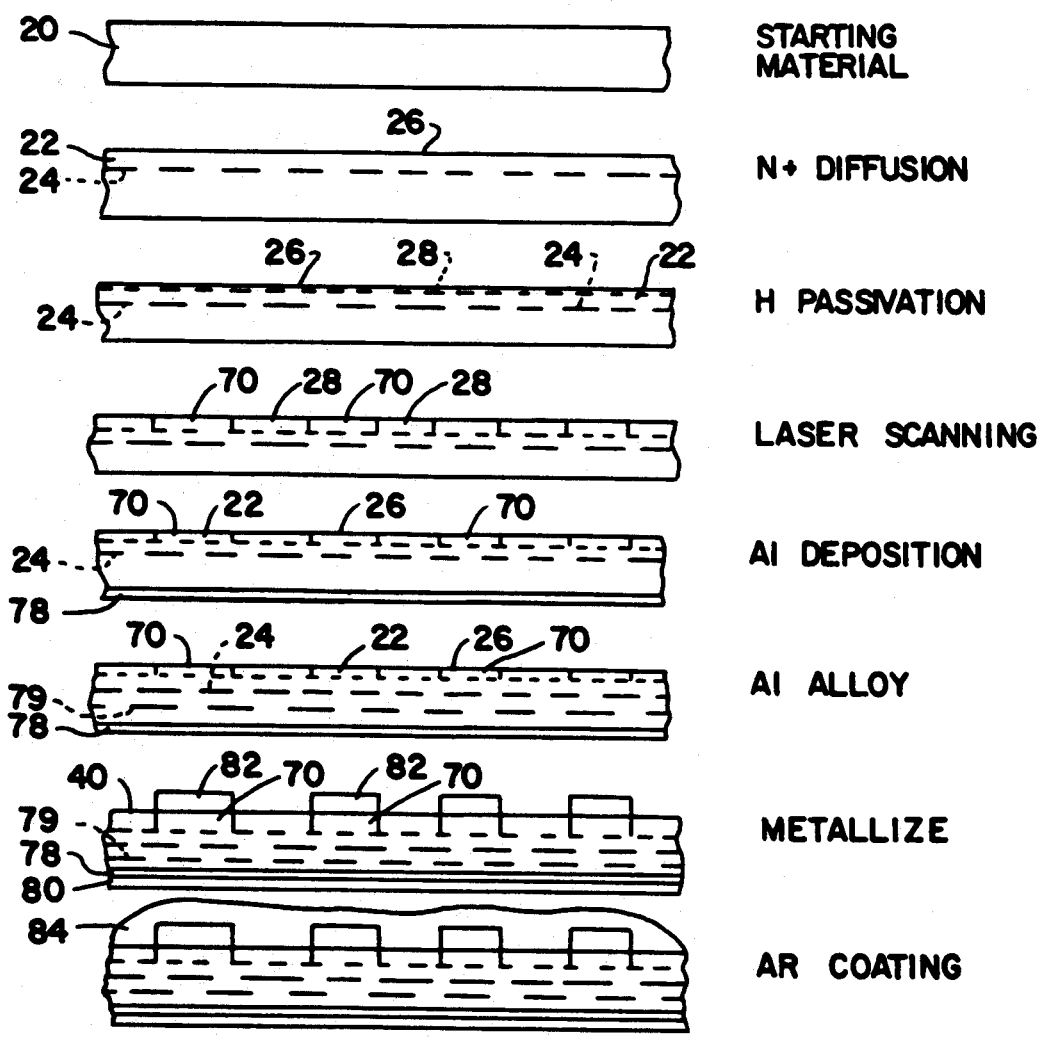
FIG. 1 illustrates the several steps involved in fabricating a solar cell according to the preferred embodiment of the present invention. For clarity of illustration, the thicknesses and depths of the several coatings and regions are not drawn to scale.

Referring to FIG. 1, the preferred embodiment of the invention relates to the fabrication of photovoltaic cells using substrates constituting portions of the P-type silicon ribbons grown by the EFG (edge-defined film-fed growth) process. As the first step, one side (hereinafter the "front side") of a pre-cleaned P-type conductivity silicon substrate 20 is doped with phosphorus so as to create an N-type conductivity region 22. The phosphorus is diffused so as to create a relatively shallow conductivity region 22, whereby the P/N junction 24 is located between about 3000 and 7000 Angstrom units below the front surface 26 of the substrate. Exemplary diffusion conditions for creating such a P/N junction 24 are well known, as evidenced by U.S. Pat. No. 4612698 to Gonsiorawski et al.

In the preferred embodiment of the present invention, the next step involves hydrogen passivating the substrate 20 so as to create a passivated region having a damaged surface layer 28 covering substantially the entire front surface of the substrate. Hydrogen passivation is a well known method of modifying polycrystalline silicon to reduce minority carrier losses at grain boundaries, dislocations and other defects in the crystal structure. These losses are reduced by introducing hydrogen into the structure of the silicon substrate.

The exact nature of surface layer 28 is not known. However, it is believed to be a damaged zone wherein the crystal structure is somewhat disrupted, wherein the silicon in part forms SiH or $SiH_2$ with hydrogen from the ion beam, and yet wherein the material is possibly amorphous. A small amount of carbon or one or more hydrocarbons appear to be necessary for the formation of the desired altered surface layer. As described in U.S. Pat. No. 4612698, it is known that nickel, deposited by immersion plating will only poorly adhere to a damaged surface layer. It is also known that a damaged layer 28 constitutes a dielectric.

Figure 2:
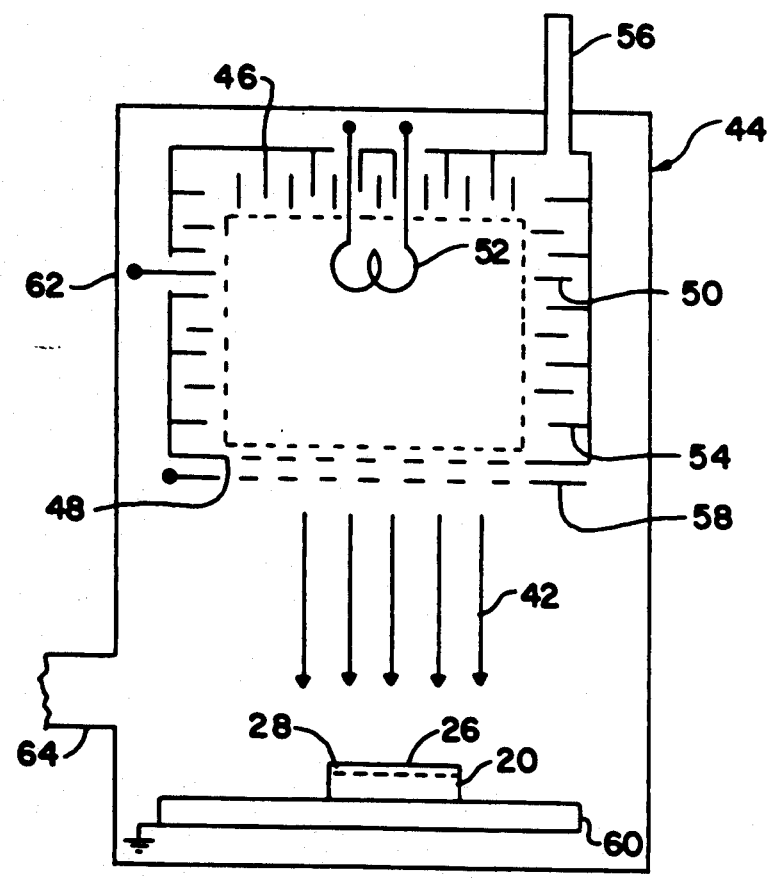
FIG. 2 is a schematic diagram showing the relationship between a photovoltaic cell substrate and a Kaufman ion source used in performing the preferred embodiment of the present method.

Referring to FIGS. 1 and 2, substrate 20 is hydrogen passivated preferably by exposing front surface 26 of the substrate to a hydrogen ion beam 42 generated by a Kaufman ion source 44. Kaufman ion sources are well known in the art, as evidenced by U.S. Pat. Nos. 3913320, 4419203, 4446403 and 4541890. Briefly, Kaufman ion source 44 comprises a hollow housing 46 having an open end 48. Anode 50, cathode 52 and magnet 54 are arranged inside of housing 46 so as to ionize a gas admitted into the housing through port 56. An accelerator grid 58 is attached to housing 46 so as to block open end 48. Grid 58 preferably comprises a pair of parallel, spaced-apart plates having a plurality of apertures formed therein. Grid 58, anode 50 and cathode 52 are coupled to suitable electrical potential sources (not shown). Gas present in housing 46 is ionized by the potential applied between anode 50 and cathode 52. Magnets 54 are provided to properly distribute the plasma throughout the interior of housing 46. The potential applied to accelerator grid 58 accelerates the ion plasma out of housing 46 through the apertures in the grid in the form of ion beam 42. A target 60 is positioned beneath accelerator grid 58 and is provided for supporting the sample to be ionized. Target 60 is at ground potential. The entire Kaufman ion source housing 46, as well as target 60, are disposed within vacuum chamber 62. The latter is pneumatically coupled via vacuum port 64 formed in housing 62 to a vacuum source (not shown) which is adapted to evacuate the interior of chamber 62. Such evacuation is effected prior to operation of the ion source 44.

Damaged layer 28 is formed in conjunction with the passivation of substrate 20. This passivation is effected by exposing front surface 26 to hydrogen ion beam 42 generated by a Kaufman ion source 44 situated about 25 cm from surface 26. Ion source 44 is preferably operated at a pressure of between about 20 and 50 mTorr (of hydrogen), with a hydrogen flow rate ranging from 25 to 40 $cm^3$/min, with a potential of about 1700 volts d.c. between source and substrate, and with a current density of between 1 and 3 milliamperes/$cm^2$ at surface 26. An exposure time of between 1 and 4 minutes has been found adequate to passivate substrate 20. Damaged layer 28 created as a result of the passivation typically has a thickness of approximately 200 Angstroms. It is thought that the foregoing procedure is a bulk hydrogen passivation process, whereby some or all of the bulk region of substrate 20 is passivated.

Figure 3:
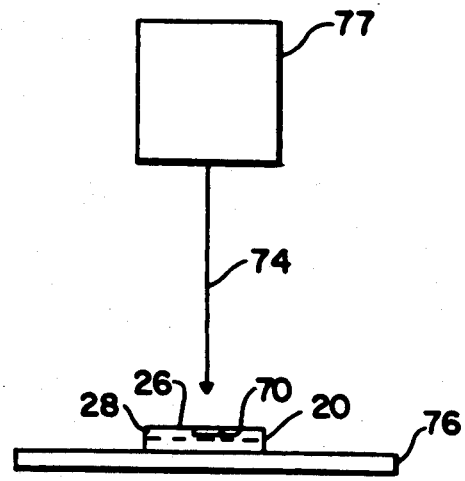
FIG. 3 is a schematic diagram showing the relationship between the photovoltaic cell substrate and the laser used in performing the preferred embodiment of the present method.

Next, as illustrated in FIGS. 1 and 3, selected portions 70 (FIGS. 1 and 3) of damaged layer 28 are exposed to a laser beam 74 generated by a laser 77. Substrate 20 is moved relative to laser beam 74 so that selected portions 70 of the damaged layer 28 are treated so as to define a conventional multi-fingered solar cell electrode grid pattern. An example of such a conventional electrode grid pattern is disclosed in U.S. Pat. No. 3686036.

The intensity and duration of exposure of laser beam 74 are selected so as to anneal the selected portions 70 of the passivated layer, whereby the annealing removes the damage existing in those selected portions 70. During this laser annealing of selected portions 70 the laser beam 74 must be controlled so as to prevent deterioration of the P/N junction.

In the preferred method of laser annealing portions 70, substrate 20 is supported on a vacuum chuck shown schematically at 76 positioned adjacent laser 77. A YAG neodimium laser ("Nd:YAG") or excimer laser may be advantageously employed as laser 77. Vacuum chuck 76 is mounted on a conventional X-Y table (not shown) that is adapted to move the substrate 20 relative to laser beam 74 so as permit formation of the desired conductor grid pattern. Laser 77 is controlled so that laser beam 74 has approximately a one watt power output. Laser 77 is also controlled so that laser beam 74 forms a circular point having a diameter approximately the width of an individual conductor finger, e.g., about 0.001". By moving the circular point across surface 26 in a straight line at the rate of about three inches per second an entire conductor finger may be formed. The X-Y table is operated so that a plurality of finger patterns are formed by the beam. This laser annealing is performed in an environment substantially free of chemical etching substances.

Laser annealing recrystallizes selected passivated portions 70 into a more regular lattice structure, thereby creating a surface to which metal plating deposited by immersion plating will adhere securely. As noted above, metal plating deposited by immersion plating will not adhere securely to a damaged surface created in conjunction with a hydrogen passivation process. Thus, by forming annealed portions 70 in damaged passivated layer 28, metallization patterns are formed without the use of a conventional photoresist and etching plating mask.

The next step involves coating the rear side of substrate 20 with a layer 78 of aluminum. The aluminum used to form layer 78 preferably comprises aluminum powder in a volatile organic vehicle, such as terpineol, that can be removed by evaporation and heating. The aluminum layer may be applied by screen printing, wherein a viscous aluminum paste is pressed through the openings in a screen placed in contact with the rear side of the substrate 20, or by evaporative deposition.

This step is then followed by an alloying step in which the substrate is heated for about 0.25 to 2.0 minutes to a temperature greater than 575° C. to remove any volatile or pyrolyzable organic components of the paste and to alloy the aluminum in the paste to the silicon substrate. In this alloying step, the aluminum coating 78 alloys with the back side of the substrate to form a P+ region 79 having a depth of from 1 to about 10 microns.

Alternatively, aluminum layer 78 may be deposited and alloyed prior to the formation of damaged surface layer 28 and the formation of selected portions 70 by laser beam 74.

Next, as illustrated in FIG. 1, conductors are applied to the selected portions 70 so as to form a grid electrode. Preferably, the formation of conductors is accomplished by immersion plating of nickel, in accordance with the process disclosed in U.S. Pat. No. 4321283 of Patel et al. This plating forms a nickel layer 80 over the entire aluminum layer 78 and a nickel layer 82 only on the selected annealed portions 70 and not on surface 26 of damaged layer 28. Thus, as discussed above, the damaged hydrogen passivated layer 28 acts as a plating mask to which nickel applied by immersion plating does not adhere securely.

Other well known procedures, such as pre-activating the surface of the silicon substrate with gold chloride, are typically performed in conjunction with the metallization step. These and other well known procedures are described in U.S. Pat. No. 4612698.

After the nickel has been applied, the substrate is heated in an inert or a nitrogen atmosphere to a temperature and for a time sufficient to sinter the nickel layers and cause the nickel layer 82 on the front side of the substrate to react with the adjacent silicon to form a nickel silicide ohmic contact. For this purpose, the substrate is preferably heated to a temperature of about 300° C. for between about 15 and about 40 minutes. This provides a nickel silicide layer with a depth of about 300 Angstrom units at the interface between nickel layer 82 and substrate 20. The nickel layer 80 on the rear side forms a alloy with aluminum layer 28. The temperature of this sintering step should not greatly exceed 300° C., as higher temperatures lead to excessive penetration into the silicon of nickel layer 82. Preferably, the deposition and sintering of the nickel is controlled such that nickel layer 82 on the front side of the substrate has a thickness of about 1000 Angstrom units.

Thereafter, the nickel of layers 80 and 82 are preferably subjected to etching, as with nitric acid, to remove unbonded nickel, and to further metallization, as with a second layer of nickel by immersion plating or other techniques well known in the art. No masking of the damaged layer 28 is required for the copper plating since the copper will not adhere to the passivated layer.

Following metallization, the cell edges (not shown) are trimmed, and an anti-reflection coating 84 is applied to the front surface of the cell. Formation of the anti-reflection coating may be accomplished by any of a number of known methods, such as by chemical vapor deposition or evaporation of, for instance, $TiPO_2$. Alternatively, anti-reflection coating 84 may be formed by the plasma deposition of silicon nitride at a temperature of about 150° C., as is well known in the art.

ALTERNATIVE EMBODIMENT

Figure 4:
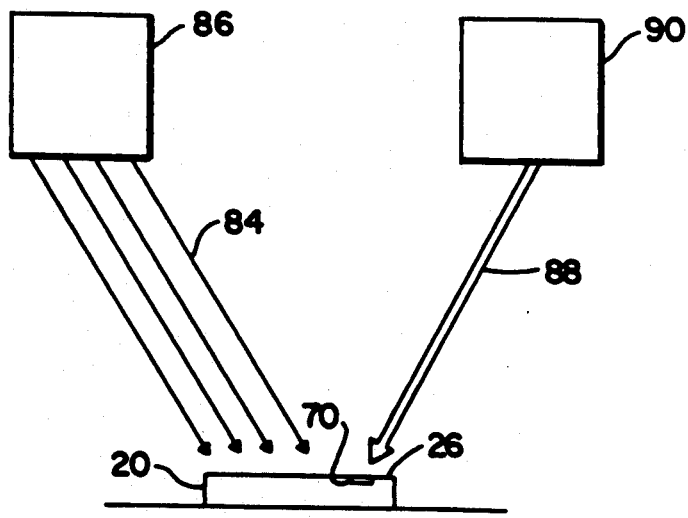
FIG. 4 is a schematic diagram showing the relationship between the photovoltaic cell substrate, the Kaufman ion source and the laser used simultaneously in performing the alternative embodiment of the present invention.

Alternatively, the hydrogen passivation and laser annealing steps may be combined into a one-step process, as illustrated in FIG. 4. A preferred method of combining these steps involves exposing front surface 26 to a hydrogen ion beam 84 generated by a Kaufman ion source 86 situated about 25 cm from surface 26. Simultaneously with this hydrogen passivation step, substrate 20 is moved relative to a laser beam 88 generated by a laser 90 situated about 30 cm from surface 26.

Ion source 86 is preferably operated at a pressure of about 30 mTorr (of hydrogen), with a potential of about 1700 eV, at a current density of about 1.5 to 4 milliamps per square centimeter, and with an exposure time of 0.5 to 2 minutes. Preferably, laser beam 88 is generated by an Nd:YAG or excimer laser 90, at a power of about 1 watt, and surface 26 of substrate 20 is moved relative to beam 88 at the rate of about 3 inches per second. The movement of substrate 20 is controlled so that laser beam 86 contacts selected portions 70. As with the preferred embodiment, selected portions 70 define a conventional solar cell electrode grid pattern. The intensity and duration of exposure of laser beam 88 is selected so as to laser anneal selected portions 70, while at the same time avoiding heating of substrate 20 to a level sufficient to cause deterioration of P/N junction 24. Thus, by this combined passivation and annealing process, conductor metallization patterns are formed in only one step.

Except for combining the passivation and laser annealing steps into a single step, solar cells are fabricated in exactly the same manner using the alternative embodiment as in the preferred embodiment.

The present method of forming metallization patterns significantly reduces the number of steps required to fabricate a solar cell. In the alternative embodiment of the present invention, the hydrogen passivation and laser annealing are performed simultaneously, whereas in the preferred embodiment the annealing and passivating are performed sequentially. By way of contrast, prior art methods using photolithography techniques require three to six or more steps to form selected metallization patterns. Thus, solar cells may be produced according to the present method at considerably reduced cost.

The passivation step of the preferred and alternative embodiments may be effected by moving substrate 20 relative to the hydrogen ion beam generated by Kaufman ion source 44 or 86, as the case may be, in continuous fashion, e.g., using a conveyor belt (not shown) positioned to extend through the vacuum chamber in which the Kaufman ion source is disposed. It has been observed that when substrate 20 is passivated in this continuous fashion, a thin layer of material (not shown) is redeposited on the front surface of the substrate. This thin layer of material is redeposited in conjunction with the formation of damaged surface layer 28.

The redeposited material is believed to consist primarily of silicon oxides ($SiO_x$), although it may comprise other materials such as oxynitrides. In this connection, the vacuum chamber in which the Kaufman ion source is disposed is maintained at a relatively low vacuum, whereby some slight infiltration of atmospheric air may occur. The redeposited material is believed to act as a capping or barrier layer which serves to reduce the out-migration of hydrogen from within the substrate. The redeposited layer also constitutes an antireflection coating having a refractive index of about 1.5.

When the redeposited material is exposed to the laser beam in accordance with the procedure and operating parameters described above with respect to the annealing step of the preferred and alternative embodiments, the redeposited material is ablated thereby exposing the underlying damaged surface layer, if any. When a damaged surface layer is present under the redeposited material the laser beam treatment also anneals the exposed damaged surface layer, thereby creating a surface to which metal plating deposited by immersion plating will securely adhere. When a damaged surface layer is not present under the redeposited material the laser beam treatment seems to reduce the number of crystalline defects in the exposed underlying silicon substrate which in turn improves the adherence of metal plating deposited on the exposed silicon substrate by immersion plating. The presence or absence of a damaged surface layer under the redeposited layer is controlled by the operating parameters of the Kaufman ion source, including the vacuum pressure in the housing in which the Kaufman ion source is disposed.

Although the present invention has been described as preferably employing an immersion plating process such as disclosed by Patel et al for electrode deposition, other processes may also be advantageously used, e.g., electroless plating. To achieve suitable results, however, the alternative metallization processes must be such that the deposited conductive materials adhere poorly or not at all to a layer of a deposited dielectric such as a damaged layer created in conjunction with a hydrogen passivation process. At the same time the metallization process must be such that the deposited metal adheres securely to an annealed damaged layer. While nickel is the preferred metal plating material, other conductive materials such as cobalt, copper, palladium, platinum and rhodium may be used to form electrodes.

The process of the present invention is not limited to the fabrication of solar cells. Thus, it may be used to form other types of semiconductor devices using single crystal or polycrystalline silicon substrates.

Since certain changes may be made in the steps of the process hereinabove described without departing from the scope of the invention, it is intended that all matter contained in the above description or shown in the accompanying drawing shall be interpreted in an illustrative and not in a limiting sense.

What is claimed is:

1. A method of forming metallization patterns on a silicon substrate that is to be used to form a photovoltaic cell comprising in sequence the steps of:
   (a) exposing a first surface of said substrate to a hydrogen ion beam of an intensity and for a duration sufficient to hydrogen passivate the substrate and form a damaged surface layer to which metals deposited by immersion plating will only poorly adhere; and
   (b) scanning selected portions of said first surface with a laser beam of an intensity and for a duration sufficient to anneal selected portions of said damaged layer so as to create a metallization pattern consisting of non-passivated areas of said first surface to which selected metals will securely adhere, said metallization pattern being created in an environment substantially free of chemical etching substances.

2. A method according to claim 1 wherein said substrate has a bulk region, and further wherein said intensity of and duration of exposure to said hydrogen ion beam are selected to achieve hydrogen passivation of said bulk region.

3. A method according to claim 1 wherein said hydrogen ion beam is created by a Kaufman ion source.

4. A method according to claim 1 wherein said first surface is exposed to said hydrogen ion beam for a time period of between 1 and 4 minutes.

5. A method according to claim 3 wherein said Kaufman ion source is operated so that (1) said hydrogen ion beam has a pressure of between 20 and 50 mTorr (of hydrogen) and current density of between 1 and 3 milliamperes/cm$^2$ at said first surface, (2) a potential of about 1700 volts d.c. is created between said Kaufman ion source and said first surface, and (3) hydrogen is consumed at a flow rate ranging from 25 to 40 cm$^3$ per minute.

6. A method according to claim 1 wherein said laser beam is generated by a YAG neodimium laser.

7. A method according to claim 1 wherein said laser beam is generated by an excimer laser.

8. A method according to claim 1 wherein said laser beam has approximately a one watt power output.

9. A method according to claim 1, said metallization pattern comprising a plurality of elongate fingers, wherein said scanning step comprises:
  generating said laser beam so that the latter forms a circular point on said first surface having a diameter approximately equal to the width of one of said plurality of elongate fingers; and
  moving said circular point across said first surface at a rate of about three inches per second.

10. A method according to claim 1 wherein said exposing step includes depositing a thin layer of material comprising SiO$_x$ on at least a portion of said first surface of said substrate, further wherein said scanning step includes scanning those sections of said thin layer of material which are deposited on said selected portions of said first surface with said laser beam for said intensity and for said duration whereby (1) said sections of said thin layer of material are ablated thereby exposing said damaged surface layer and (2) said exposed damaged surface layer is annealed so that said selected metals will adhere securely thereto.

11. A method of forming metallization patterns on a silicon substrate that is to be used to form a photovoltaic cell comprising simultaneously performing the steps of:
  (a) exposing a first surface of said substrate to a hydrogen ion beam of an intensity and for a duration sufficient to hydrogen passivate the substrate and form a damaged surface layer to which metals deposited by immersion plating will only poorly adhere; and
  (b) scanning selected portions of said first surface with a laser beam of an intensity and for a duration sufficient to anneal selected portions of said damaged layer so as to create a metallization pattern consisting of non-passivated areas of said first surface to which selected metals will securely adhere, said metallization pattern being created in an environment substantially free of chemical etching substances.

12. A method of fabricating a photovoltaic cell comprising in sequence the steps of:
  (a) providing a crystalline substrate having opposing first and second surfaces;
  (b) forming a P/N junction in said substrate adjacent said first surface;
  (c) exposing said first surface to a hydrogen ion beam of an intensity and for a duration sufficient to hydrogen passivate the substrate, wherein a damaged surface layer to which metals deposited by immersion plating will only poorly adhere is formed in conjunction with said hydrogen passivation of the substrate, said ion beam being created by a Kaufman ion source;
  (d) scanning selected portions of said damaged surface layer with a laser beam of an intensity and for a duration sufficient to anneal said selected portions and thereby create a pattern of regions on said first surface to which metals deposited by immersion plating will securely adhere, said pattern being created in an environment substantially free of chemical etching substances and said laser beam being controlled so that said laser beam does not cause deterioration of said P/N junction;
  (e) applying a coating of aluminum to said second surface and thereafter heating said silicon substrate to a temperature and for a time sufficient to cause said coating to alloy with said silicon substrate; and
  (f) depositing electrodes by immersion plating on said regions of said first surface.

13. A method of fabricating a photovoltaic cell comprising in sequence the steps of:
  (a) providing a crystalline substrate having opposing first and second surfaces;
  (b) forming a P/N junction in said substrate adjacent said first surface;
  (c) applying a coating of aluminum to said second surface and thereafter heating said silicon substrate to a temperature and for a time sufficient to cause said coating to alloy with said silicon substrate;
  (d) exposing said first surface to a hydrogen ion beam of an intensity and for a duration sufficient to hydrogen passivate the substrate, wherein a damaged surface layer to which metals deposited by immersion plating will only poorly adhere is formed in conjunction with said hydrogen passivation of the substrate;
  (e) scanning selected portions of said damaged surface layer with a laser beam of an intensity and for a duration sufficient to anneal said selected portions and thereby create a pattern of regions on said first surface to which metals deposited by immersion plating will securely adhere, said pattern being created in an environment substantially free of chemical etching substances and said laser beam being controlled so that said laser beam does not cause deterioration of said P/N junction; and
  (f) depositing an electrode by immersion plating on said regions of said first surface.

14. A method according to claim 13 wherein said ion beam is created by operation of a Kaufman ion source.

* * * * *